(12) United States Patent
Iyoda et al.

(10) Patent No.: US 8,163,189 B2
(45) Date of Patent: Apr. 24, 2012

(54) METHOD FOR PRODUCING A NANOPOROUS SUBSTRATE

(75) Inventors: Tomokazu Iyoda, Yokohama (JP); Kaori Kamata, Yokohama (JP); Ryoko Watanabe, Yokohama (JP)

(73) Assignee: Tokyo Institute of Technology, Tokyo (JP)

( * ) Notice: Subject to any disclaimer, the term of this patent is extended or adjusted under 35 U.S.C. 154(b) by 1005 days.

(21) Appl. No.: 12/093,343

(22) PCT Filed: Nov. 14, 2006

(86) PCT No.: PCT/JP2006/322616
§ 371 (c)(1),
(2), (4) Date: May 12, 2008

(87) PCT Pub. No.: WO2007/055371
PCT Pub. Date: May 18, 2007

(65) Prior Publication Data
US 2009/0117335 A1    May 7, 2009

(30) Foreign Application Priority Data

Nov. 14, 2005 (JP) ................................. 2005-328815

(51) Int. Cl.
*H01L 21/302* (2006.01)
*B82B 3/00* (2006.01)

(52) U.S. Cl. ............ 216/41; 216/49; 438/694; 438/700; 438/942; 438/947; 977/888; 977/892; 977/895

(58) Field of Classification Search .................. None
See application file for complete search history.

(56) References Cited

U.S. PATENT DOCUMENTS 6,565,763 B1 * 5/2003 Asakawa et al. ................. 216/56
2005/0250053 A1 * 11/2005 Marsh et al. ................... 430/323

FOREIGN PATENT DOCUMENTS

| JP | 2004-124088 | 4/2004 |
|---|---|---|
| JP | 2005-052909 | 3/2005 |
| JP | 2005-314121 | 11/2005 |
| WO | WO2007/055371 | 5/2007 |

OTHER PUBLICATIONS

Tian, Y. et al "Synthesis, Nanostructures, and Functionality of Amphiphilic Liquid Crystalline Block Copolymers with Azobenzene Moieties" Macromolecules, 35, 3739-3747, published on Web Mar. 29, 2002.*
Jung, S. Y. et al "Mixing State of Amphiphilic Di-block Copolymer/Homopolymer Blends" Journal of Thermal Analysis and Calorimetry, 81, 563-567, Aug. 1, 2005.*
Chien et al., "Nanomachinging of (110)-oriented silicon by scanning probe lithography and anisotropic wet etching," Applied Physics Letters. vol. 75, No. 16 pp. 2429-2431 (1999).
Guarini et al., "Process integration of self-assembled polymer templates into silicon nanofabrication," Journal of Vacuum Science & Technology B. vol. 20 pp. 2788-2792 (2002).
International Search Report corresponding to International Patent Application No. PCT/JP2006/322616 dated Feb. 20, 2007.
Koh et al., "Simple nanostructuring on silicon surface by means of focused beam patterning and wet etching," Applied Surface Science. vols. 162-163 pp. 599-603 (2000).
Yang et al., "Nanoscopic templates using self-assembled cylindrical diblock copolymers for patterned media," Journal of Vacuum Science & Technology B. vol. 22, No. 6 pp. 3331- 3334 (2004).
Extended European Search Report corresponding to European Patent Application No. 06832578.6-1235 dated Aug. 27, 2009.

* cited by examiner

*Primary Examiner* — Anita Alanko
(74) *Attorney, Agent, or Firm* — Jenkins, Wilson, Taylor & Hunt, P.A.

(57) ABSTRACT

Nanoporous substrate with fine pores having a diameter from 3 to 40 nm arranged with less than 60 nm periodicity is prepared by a method comprising the steps of coating amphipathic block copolymer on a substrate, forming a film containing hydrophilic cylinders aligned perpendicularly to the surface of the film on a substrate, and immersing the substrate into a solution containing an etchant.

9 Claims, 3 Drawing Sheets

METHOD FOR PRODUCING A NANOPOROUS SUBSTRATE

FIELD OF THE INVENTION

The present invention relates to a method for producing a nanoporous substrate having fine pores on the surface which are arranged with periodicity, more specifically, to a method for producing a nanoporous substrate with fine pores on the surface arranged with periodicity by etching the substrate by using a microphase separation film with hydrophilic cylinders arranged with periodicity.

PRIOR ART

Fine pore structure on a substrate surface is currently prepared by such fine processing technologies as photolithography or electron beam lithography. These dry processes are applied particularly to fine pattern transcription techniques of semiconductor integrated circuit. Actually, those patterned with high accuracy in micrometer region are prepared. However, these techniques need laser light source and resist materials adjusted to the patterning size and the conventional apparatus need expensive facilities to keep high vacuum and/or high voltage. Therefore, it is required to improve these apparatus and the cost efficiency.

Other technologies under developing include those to form patterning on a semiconductor substrate surface by using scanning probe microscope (SPM) or electron beam (EB) to prepare a fine structure by wet-chemical etching. In the example using SPM, fine lines with 300 nm high and 60 nm wide were prepared (Reference 2). In the example using EB, a silicon surface arranged with periodicity of 100 nm with square fine pore with 50 nm sides is obtained (Reference 3). However, these processes have difficulties such as the very slow speed to apply to mass production and the very expensive apparatuses.

The current processes of transferring the microstructure using microphase separation of block copolymer as a mask are basically dry processes, and these are reactive ion etching (RIE). It is often conducted to transfer a nanosize pattern to a substrate surface by domain-selective etching. In these conventional processes, the lower limit of periodicity (i.e. spacing) for structure transfer to a substrate is around 40 nm (Reference 4, 5, etc.).

Reference 1: Japanese Patent Publication No. 2004-124088
Reference 2: Applied Physics Letters 1999, 75, 2429-2431
Reference 3: Applied Surface Science 2000, 162-163, 599-603
Reference 4: Journal of Vacuum Science & Technology, B 2002, 20, 2788-2792
Reference 5: Journal of Vacuum Science & Technology. B 2004, 22, 3331-3334

Problems to be Solved by the Invention

It is an object of the present invention to provide a method for producing a nanoporous substrate with fine pores arranged with less than 40 nm periodicity, which has not been accomplished by prior methods. Namely, the present invention provides a method for transferring nanophase separation structure in polymer thin film to a substrate surface by a wet etching method, and a method for producing s silicon wafer, a glass substrate and a polymer film such as PET film, which has a surface ultra fine structure in nanometer region, which are not attained by conventional lithography techniques.

Means to Solve the Problems

In order to solve the problems, the present inventors utilize an amphipathic block copolymer, which is developed by the present inventors before (Reference 1). When the amphipathic block copolymer is coated on a substrate, a nanophase separation structure with hydrophilic cylinders perpendicularly aligned to the film surface is formed in a matrix of hydrophobic domain. Thus obtained substrate having a film on the surface with nanophase separation structure is immersed into an etchant solution. The phase separation structure in polymer thin film functions as a mask material to overlay the substrate surface and the etchant penetrates and diffuses into the hydrophilic cylinders to erode the substrate surface. Then a nanoporous substrate with fine pores can be produced, wherein the fine pores are arranged with periodicity on the surface. The transcribed fine pore structure can be freely tunable, by changing the etching rate by the film thickness of the polymer thin film, the temperature or the concentration of the etchant; and by changing the diameter of hydrophilic nanocylinders and the distance between cylinders by the polymerization degree of polymer.

Then the present invention is a method for producing a nanoporous substrate comprising the steps of forming a film comprising amphipathic block copolymer on a substrate, immersing the substrate into a solution containing an aqueous etchant for the substrate, and removing the film from the substrate, wherein the film contains hydrophilic cylinders aligned perpendicularly to the surface of the film, the hydrophilic cylinders have a diameter from 3 to 40 nm and are arranged with less than 60 nm periodicity, and the surface of the substrate corresponding to the hydrophilic cylinders are treated with the etchant.

Furthermore, the present invention is a nanoporous substrate produced by the method, wherein the substrate is treated with the etchant, where the etched area has a diameter from 3 to 40 nm and less than 60 nm periodicity, and especially the nanoporous substrate, wherein the substrate has fine pores on the surface having a diameter from 3 to 40 nm that are arranged with less than 60 nm periodicity.

Effect of the Invention

By using the method of the present invention, it is possible to fabricate fine porous pattern on substrate surface with periodicity of less than 40 nm, for example 10 nm, which has not been achieved by conventional fine processing technology. Since the method of the present invention is a combination of the block copolymer with hydrophilic cylindrical domain and the hydrophilic etchant, the etching process is one step and is very simple. Additionally, the method of the present invention needs not to use expensive light source and apparatus, which are necessary for conventional photolithography and dry processes.

DETAILED DESCRIPTION OF THE INVENTION

Figure 1:
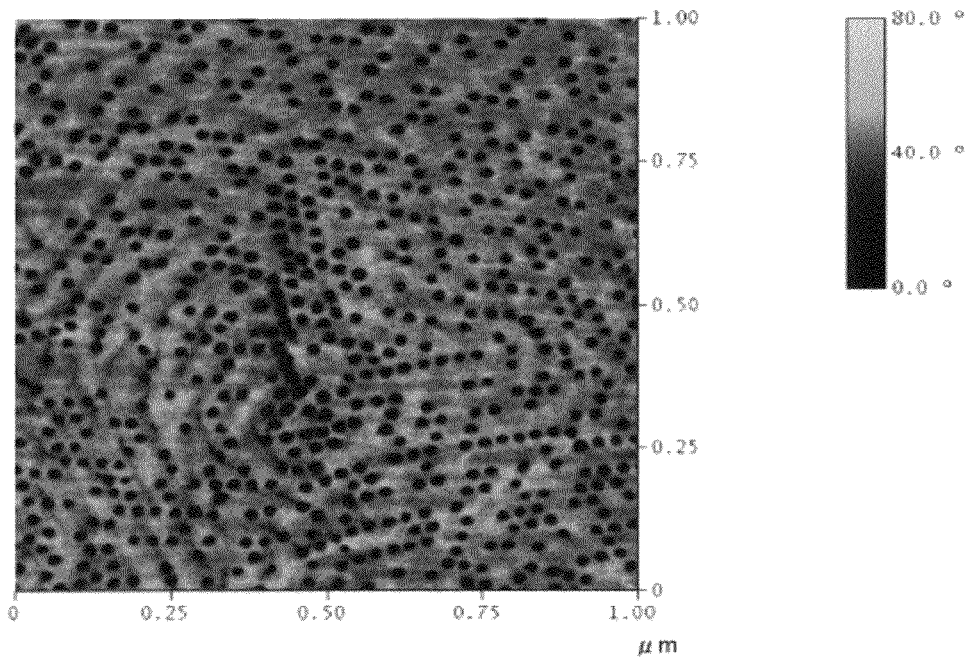
FIG. 1 shows AFM phase image of the block copolymer thin film after heat treatment. Black dots represent the hydrophilic polyethylene oxide domain.

The amphipathic block copolymer used in the present invention is represented by the following chemical formula 1:

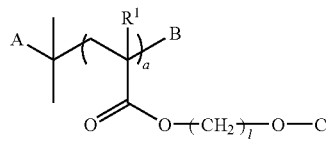

In the formula, A represents a hydrophilic polymer chain and includes, for example, poly(ethylene oxide), poly(butylene oxide), poly(methylene ether), poly(propylene oxide), poly(vinyl alcohol), poly(acryl acid), poly(methacrylic acid), poly(acrylamide), oligo(ethylene oxide), crown ether, cryptand; or poly(methacrylate), poly(acrylate) or the like, preferably poly(ethylene oxide) or poly(methylene ether), which have a sugar chain at a side chain. A is preferably poly(ethylene oxide) chain represented by a general formula —COO($CH_2CH_2O$)$_b$$R^4$ (in the formula, b represents an integer from 5 to 500. $R^4$ represents an alkyl group such as methyl group).

B represents a halogen atom, preferably chlorine or bromine atom.

"a" represents an integer from 5 to 500.

$R^1$ represents a hydrogen atom or an alkyl group. As an alkyl group, an alkyl group with carbon number from 1 to 3 is preferred and methyl group is more preferred.

l is an integer from 4 to 30, preferably from 11 to 20.

C represents a liquid crystallogene chain and is preferably represented by the following formula:

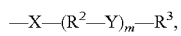

In the formula, X and Y independently represent a divalent aromatic group or a heterocyclic group; for example, they may include 1,4-phenylene, 1,4-cyclohexylene, 1,4-cyclohexenylene, naphthalene-2,6-diyl, decahydronaphthalene-2,6-diyl, 1,2,3,4-tetrahydronaphthalene-2,6-diyl, 1,4-bicyclo[2,2,2]octylene, 1,3-dioxan-2,5-diyl, pyridine-2,5-diyl, pyradine-2,5-diyl, pyridadine-3,6-diyl, pyrimidine-2,5-diyl. These groups may contain substituent(s).

$R^2$ represents a single bond, —$CH_2CH_2$—, —$CH_2O$—, —$OCH_2$—, —C(=O)O—, —OC(=O)—, —C≡C—, —CH=CH—, —CF=CF—, —($CH_2$)$_4$—, —$CH_2CH_2CH_2O$—, —$OCH_2CH_2CH_2$—, —CH=CH—$CH_2CH_2$—, —$CH_2CH_2$—CH=CH—, —N=N—, —CH=CH—COO—, —OCO—CH=CH—, —CH=CH—CO—, or —CO—CH=CH—, preferably —CH=CH—, —N=N—, —CH=CH—CO—, or —CO—CH=CH—.

m is an integer from 1 to 4, preferably 1.

$R^3$ represents a hydrogen atom, a halogen atom, an alkyl group, an alkoxy group, a cyano group, a mercapto group, a nitro group, or an amino group, preferably an alkyl group or an alkoxy group. The carbon number of the alkyl and alkoxy groups is preferably from 1 to 10 and these groups may have branched chains.

The liquid crystalline mesogen group functions as a hydrophobic polymer chain and forms a block copolymer by binding to the hydrophilic polymer chain (A).

The molecular weight of the block copolymer is preferably from 5000 to 100000, more preferably from 10000 to 50000.

Moreover, $R^2$ containing vinyl group in liquid crystalline mesogen chain has excellent reactivity. Intermolecular bridges are formed through dimerization reaction between vinyl groups by the irradiation of UV or electron beam, then a phase separation structure is fixed.

The volume fraction of hydrophilic polymer chain (A) in copolymer is preferably from 10% to 90%, and more preferably from 10% to 50%.

As the above block copolymer is dissolved in a solvent and a film of the copolymer is formed on a substrate, a microphase separation structure is generated in the film based on repulsive interaction between hydrophilic polymer chains and hydrophobic polymer chains.

The film with the microphase separation structure possesses cylindrical array-type separation structure with hexagonal closest packing perpendicularly aligned. In the film with the cylinder array-type separation structure, the hydrophilic polymer chain component becomes cylindrical domain and the hydrophobic polymer component becomes the domain other than the cylindrical domain. Therefore, it is possible to change the size and spacing of the cylindrical domain by altering volume fraction of the hydrophilic polymer chain. Namely, it will lessen the size or expand the periodicity of the cylindrical domain to reduce the volume fraction of the hydrophilic polymer chain component (A), while it will enlarge the size or narrow the periodicity thereof to increase the volume fraction of the hydrophilic polymer chain component (A). It is preferable to alter the volume fraction of the hydrophilic polymer chain component (A) in the range from 10 to 90%. The volume fraction of the hydrophilic polymer chain component (A) less than 10% might make it difficult to form cylindrical array-type separation structure perpendicularly aligned because of the reduction of the fraction occupied by the cylindrical domain. On the other hand, the volume fraction more than 90% might make it equally difficult to form cylindrical array-type separated structure perpendicularly aligned because of the augmentation of the fraction occupied by the cylindrical domain.

The cylinder thus formed have a diameter from 3 to 40 nm, particularly from 3 to 20 nm, and periodicity in the range less than 60 nm, especially from 15 to 40 nm. The cylinder may be designed freely in the above range.

The general method for coating the block copolymer on a substrate generally includes dissolving the bock copolymer in appropriate solvent, coating a substrate with the solution and drying the coated substrate. The solvent includes, for example, benzene, toluene, xylene, chloroform, dichloromethane, tetrahydrofuran, dioxane, carbon tetrachloride, ethylbenzene, propylbenzene, dichloroethylene, chloromethyl and the like. Preferable concentration of the block copolymer in the solution is roughly from 0.1 wt % to 5 wt %.

Polyalkylene oxide may be added to the coating solution. Addition of polyalkylene oxide may be effective in increasing the size of cylinder diameter as well as in removing the reaction product of the etching reaction at the boundary between substrate and spin coat thin layer. The polyalkylene oxide includes polyethylene oxide, i.e. the compound represented preferably by the general formula $R^5$—(O$R^6$)$_n$—O$R^7$, wherein $R^5$ and $R^7$ represent a hydrogen atom or an alkyl chain (carbon number from 1 to 10), and $R^6$ represents —$C_mH_{2m}$— (m is from 2 to 4, preferably 2) and n represents an integer from 1 to 20. The amount of the added polyalkylene oxide is preferably that in which the volume fraction of the total polyalkylene oxide to the hydrophilic polymer chain of block copolymer is less than 80%.

The method for coating the block copolymer of the substrate includes spin coat, cast, dip, bar coat and the like.

The film thickness of the block copolymer is preferably from about 30 nm to about 10 μm. The alignment process may be performed by heating the block copolymer after coating, or may be performed simultaneously by coating the block copolymer on the substrate and by heating.

The heating temperature is preferably in the temperature range from minus 20° C. to plus 40° C. of the melting temperature (generally from 50° C. to 150° C.) of the block copolymer, more preferably from minus 10° C. to plus 20° C. of the melting temperature. The melting temperature of the block copolymer is measurable by differential scanning calorimetry.

Substrates usable include any substrates: for example, such substrates as polyester, polyimide, mica plate, silicon wafer, quartz plate, glass plate, various metal plates and the like and the substrates treated with such hydrophobic coating as carbon vapor deposition process and silylation process. However, silicon wafer, quartz plate, glass plate, and various metal plates are practically preferably used.

Additionally, the substrate surface may be flat as well as curved such as spherical, cylindrical surface and the like.

Aqueous etchant may be appropriately chosen based on the combination of etchant and substrates.

For example, acids such as hydrochloric acid and sulfuric acid can be used when the substrate is any of various corrosive metal plates. Phosphoric acid can be used when the substrate is an aluminium plate, and potassium cyanate can be used when the substrate is a gold plate. Furthermore, hydrogen fluoride, aluminium fluoride, potassium hydroxide, ethylenediamine and the like can be used when the substrate is silicon. Strong alkalis can be used when the substrate is a polyimide film. Still furthermore, hydrogen fluoride can be used when the substrate is a glass plate. Etching condition (temperature, etching time period, composition and concentration of the etchant) can be appropriately chosen based on the substrates and the etchant Etching thus described allows the substrate surface corresponding to hydrophilic cylinders in the above film to be treated with the etchant. As the result, fine pores and protrusions, especially fine pores with the size corresponding to the hydrophilic cylinder are formed at the site corresponding to hydrophilic cylinder. Namely, cylindrical structure in film is transferred to the substrate. To remove the film from the substrate after the formation of fine pores and the like, any means can be used and the above solvent can be used to remove the film by dissolving the film.

As the result, nanoporous substrate containing fine pores or protrusions with diameter from 3 to 40 nm, especially fine pores, arranged with periodicity of less than 60 nm is prepared. As described previously, the size and periodicity of the fine pores and the like can be freely contrived by designing appropriately cylinders in the film.

The following examples illustrate the present invention, but it is not intended to limit the scope of the present invention.

EXAMPLE 1

First, a block copolymer was synthesized. The block copolymer comprises poly(ethylene oxide)methyl ether (M.W.: 5000) as a hydrophilic polymer chain and polymethacrylate with polymelyzation degree of 114 including azobenzene-containing liquid crystalline side chain as a hydrophobic polymer chain. The synthesis was performed by atom transfer radical polymerization method catalyzed by copper complex. A block copolymer was obtained and is represented by the following chemical formula 2:

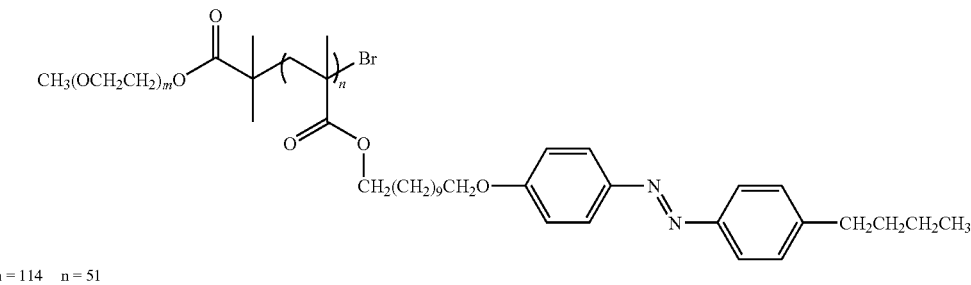

m = 114   n = 51

The number average molecular weight of the block copolymer was 30000, Mw/Mn=1.49, polymethacrylate (MA) content was 83 wt % and melting point was 120° C.

Thus obtained block copolymer of 0.0189 g was blended with 0.0109 g of PEO7 (NOF corporation, polyethylene oxide with M.W. of 400 and polymerization degree of 7). The blend ratio was adjusted to make PEO7 content in total PEO cylinders to be 77 volume % by converting to ethylene oxide monomer unit [EO]. The mixture was dissolved in chloroform and gave 3 wt % solution. The solution was used to prepare spin coat thin film on undoped silicon wafer (100), which had been treated with isopropanol ultrasonic cleaning. The film thickness was about 0.1 μm.

The silicon wafer was heat-treated at 140° C. for 1 h.

As the result, microphase separation structure film was prepared on silicon wafer. The AFM image of the obtained thin film is shown in FIG. 1.

The obtained silicon wafer was dipped in aqueous ammonium fluoride solution (33%) for 3 min. Then, the wafer was taken out from the solution and was washed with a large amount of distilled water.

Figure 2:
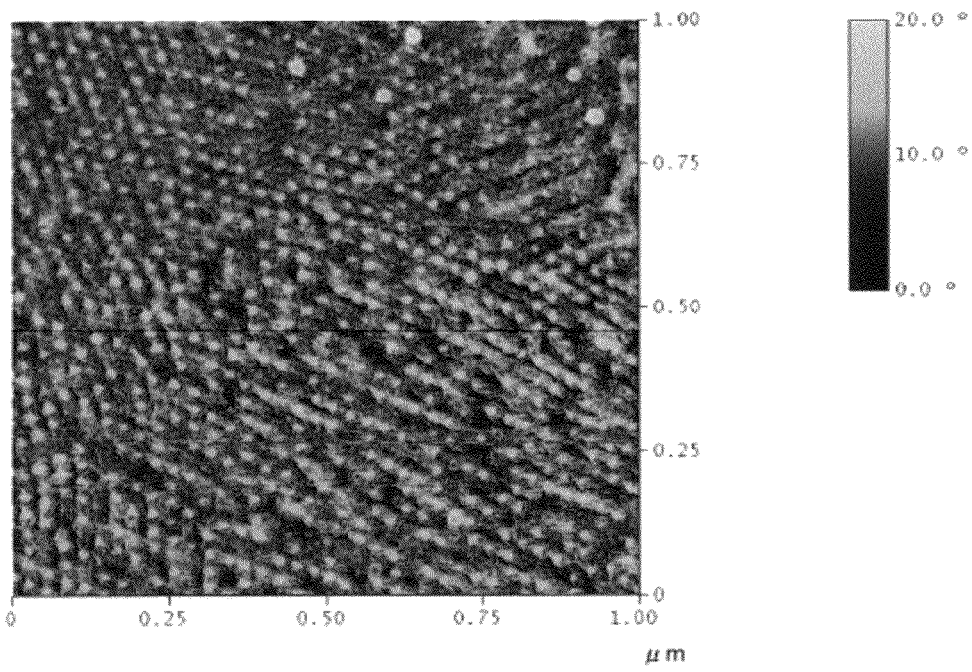
FIG. 2 shows AFM phase image of the block copolymer thin film remained on the substrate after etching. White dots represent the polyethylene oxide domain. As the microphase separation structure remains after etching process, so it is shown that the film functions as a mask.

The AFM image of residual block copolymer thin film is shown in FIG. 2.

Then, the silicon wafer was dipped in several tens ml of chloroform for several minutes and washed by stirring a little to dissolve the block copolymer thin film. After that, the silicon wafer was taken out, allowed the substrate to be dried for several seconds, washed by dipping sequentially in acetone and water and finally dried by a blower.

Figure 3:
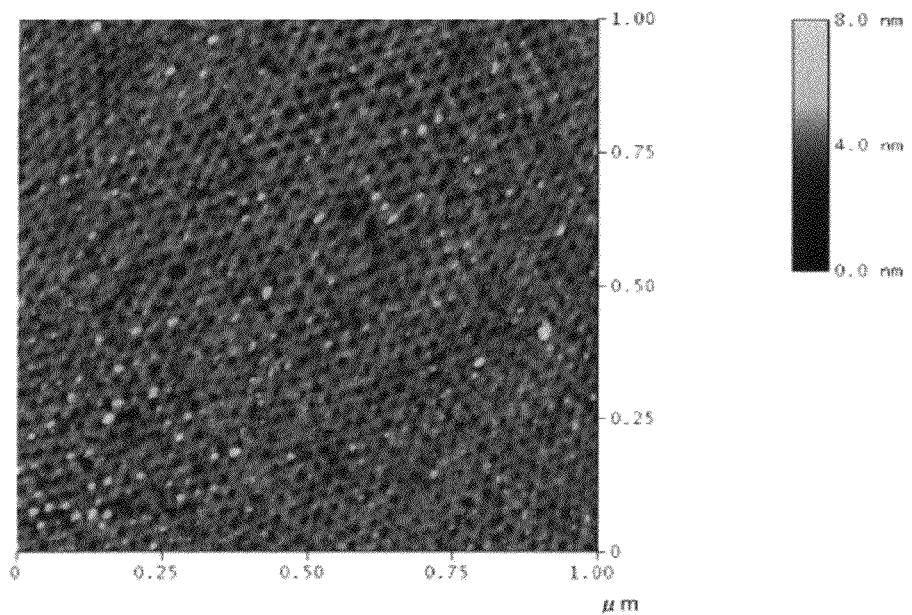
FIG. 3 shows AFM height image of the silicon wafer after removal of the film. Black dots represent fine pores formed by etching and white protrusions seem to be residues of etching reaction products. It is shown that the microphase separation structure of the block copolymer is transferred to the silicon wafer.
Figure 4:
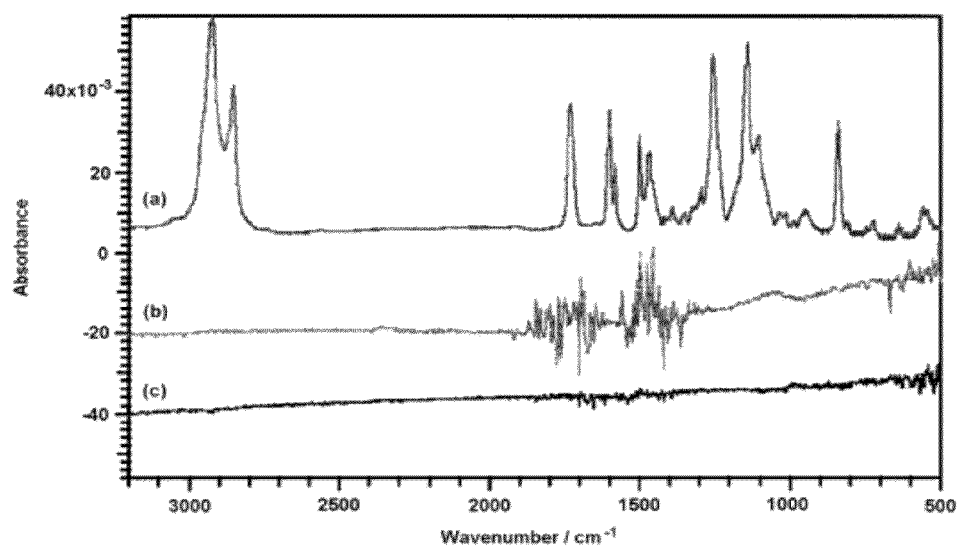
FIG. 4 shows the Fourier transform infrared spectrum of the silicon wafer after removal of film.
Figure 5:
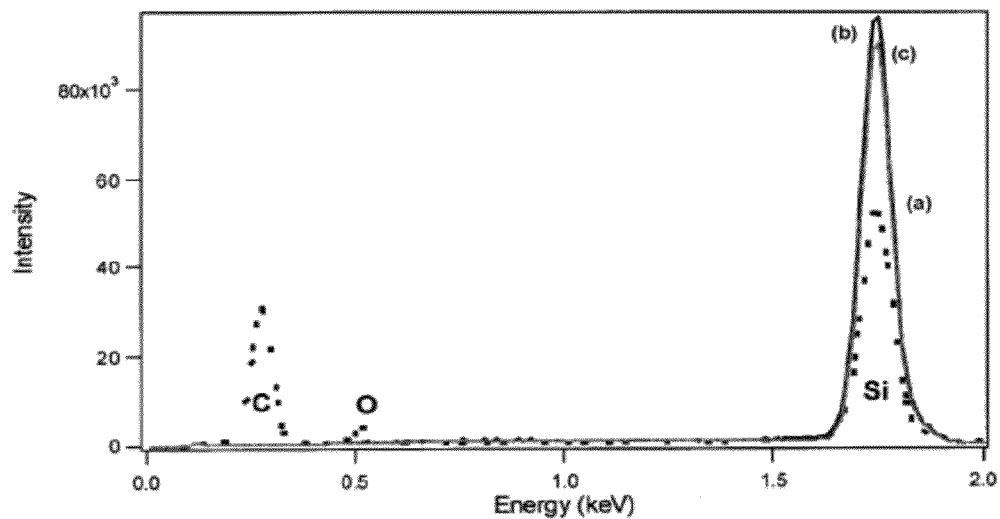
FIG. 5 shows the energy dispersive X-ray spectrum of the silicon wafer after removal of film.

The AFM image of the silicon wafer after washing is shown in FIG. 3. The results of Fourier transform infrared spectrometry and energy dispersive X-ray spectrometry of the substrate are shown in FIG. 4 and FIG. 5, respectively.

It is shown that block copolymer thin film was completely removed.

A dot pattern of fine pores with depth of at least several nm hexagonally arranged with periodicity of about 25 nm by using simple wet etching the mask of block copolymer thin film could be fabricated on the silicon wafer. Based on the AFM image, it was found that the diameter of the fine pores was about 10 nm.

EXAMPLE 2

Mixture of 0.359 g of toluene solution of 2 wt % of block copolymer and 0.077 g of toluene solution of 2 wt % of PEO7 were blended similarly to example 1. The blend ratio was 56 volume % of PEO7 component in total PEO cylinders by converting to ethylene oxide monomer unit [EO].

Spin coat thin film on undoped silicon wafer (100) treated with isopropanol ultrasonic cleaning was prepared by using the blend solution. The film thickness was about 0.1 μm. The silicon wafer was heat-treated at 140° C. for 1 h.

The obtained silicon wafer was dipped in aqueous ammonium fluoride solution (33%) for 5 min. Then, the wafer was taken out from the solution and was washed with a large amount of distilled water. Then, the silicon wafer was dipped in several tens ml of chloroform for several minutes and washed by stirring a little to dissolve the block copolymer thin film. After that, the silicon wafer was taken out, allowed the substrate to be dried for several seconds, washed by dipping sequentially in acetone and water and finally dried by a blower.

Figure 6:
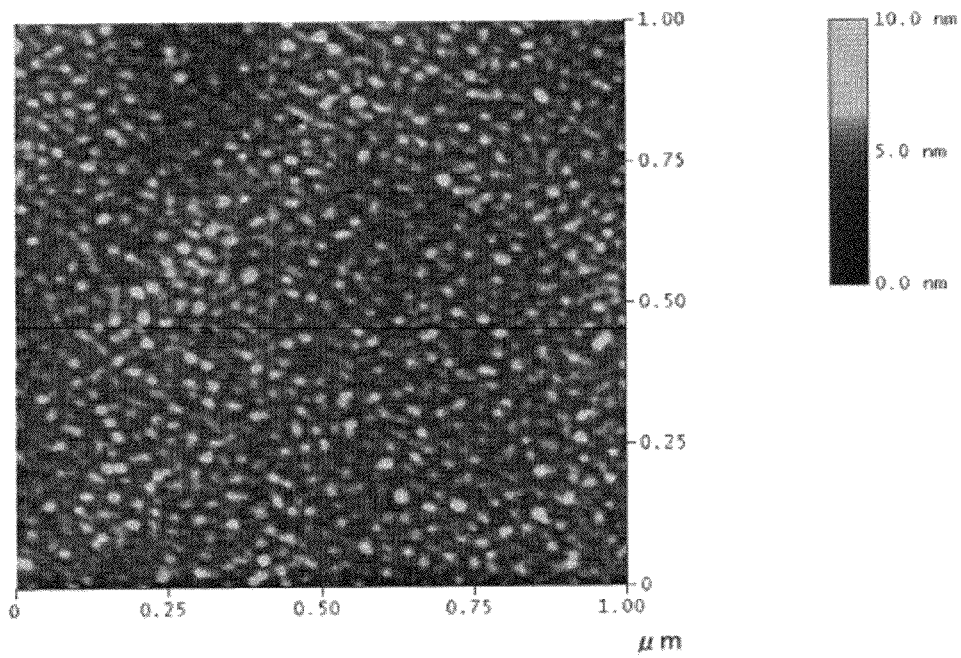
FIG. 6 shows AFM height image of the silicon wafer. White dots represent protrusions.

The AFM image of the silicon wafer after washing is shown in FIG. 6.

Protrusions with diameter of about 15 nm and with height of about 2 nm arranged with periodicity of about 30 nm on the substrate were observed.

The method of the present invention is applicable to prepare the substrate, wherein functional nano-particles of noble metal or semiconductor are arranged, and nanomold of silicon or silicon dioxide, which are excellent in mechanical strength for nano-imprint technology. These technologies are applicable to fine processing technologies such as fabrication of high density information storage media and the like. Moreover, fabricated nanoporous silicon substrate can be applied to optoelectronics materials, since it has emission function due to quantum size effect. Furthermore, the nanoporous materials obtained by electrolytic etching of the substrate fabricated by the method of the present invention is applicable to catalytic substance, nanofilter and the like.

What is claimed is:

1. A method for producing a nanoporous substrate comprising the steps of: (a) forming a film comprising an amphipathic block copolymer on a substrate, wherein the amphipathic block copolymer is represented by chemical formula 1:

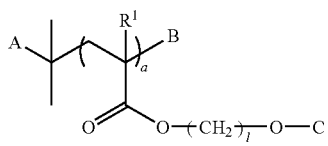

wherein A represents a hydrophilic polymer chain, B represents a halogen atom, $R^1$ represents a hydrogen atom or an alkyl group, "a" represents an integer from 5 to 500, l represents an integer from 4 to 30 and C represents a liquid crystalline mesogen chain; (b) immersing the substrate with the film comprising the amphipathic block copolymer thereon into a solution containing an aqueous etchant for the substrate, wherein the film contains hydrophilic cylinders aligned perpendicularly to the surface of the film, the hydrophilic cylinders have a diameter from 3 to 40 nm and are arranged with less than 60 nm periodicity and wherein the surface of the substrate corresponding to the hydrophilic cylinders is treated with the etchant; and (c) removing the film from the substrate.

2. The method of claim 1, wherein fine pores having the same diameter as that of the hydrophilic cylinder are formed at the site on the surface of the substrate corresponding to the hydrophilic cylinders.

3. The method of claim 1, wherein the liquid crystalline mesogen chain (C) is represented by the formula:

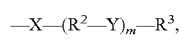

wherein X and Y independently represent a divalent aromatic group or a heterocyclic group that may have substituent(s); $R^2$ represents a single bond, $-CH_2CH_2-$, $-CH_2O-$, $-OCH_2-$, $-C(=O)O-$, $-OC(=O)-$, $-C=C$, $-CH=CH-$, $-CF=CF-$, $-(CH_2)_4-$, $-CH_2CH_2CH_2O-$, $-OCH_2CH_2CH_2O-$, $CH=CH-CH_2CH_2-$, $-CH_2CH_2-CH=CH-$, $-N=N-$, $-CH=CH-COO-$, $-OCO-CH=CH-$, $-CH=CH-CO-$, or $-CO-CH=CH-$; $R^3$ represents a hydrogen atom, a halogen atom, an alkyl group, an alkoxy group, a cyano group, a mercapto group, a nitro group, or an amino group; and m represents an integer from 1 to 4.

4. A nanoporous substrate produced by the method of claim 1, wherein the substrate is treated with the etchant, where the etched area has a diameter from 3 to 40 nm and less than 60 nm periodicity.

5. The nanoporous substrate of claim 4, wherein the substrate has fine pores on the surface having a diameter from 3 to 40 nm that are arranged with less than 60 nm periodicity.

6. A nanoporous substrate produced by the method of claim 2, wherein the substrate is treated with the etchant, where the etched area has a diameter from 3 to 40 nm and less than 60 nm periodicity.

7. The nanoporous substrate of claim 6, wherein the substrate has fine pores on the surface having a diameter from 3 to 40 nm that are arranged with less than 60 nm periodicity.

8. A nanoporous substrate produced by the method of claim 3, wherein the substrate is treated with the etchant, where the etched area has a diameter from 3 to 40 nm and less than 60 nm periodicity.

9. The nanoporous substrate of claim 8, wherein the substrate has fine pores on the surface having a diameter from 3 to 40 nm that are arranged with less than 60 nm periodicity.

* * * * *